US006888332B2

(12) United States Patent
Matsushita (10) Patent No.: US 6,888,332 B2
(45) Date of Patent: May 3, 2005

(54) COMPUTER SYSTEM AND METHOD OF CONTROLLING ROTATION SPEED OF COOLING FAN (75) Inventor: Satoshi Matsushita, Ome (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 266 days.

(21) Appl. No.: 09/880,043

(22) Filed: Jun. 14, 2001

(65) Prior Publication Data
US 2002/0020755 A1 Feb. 21, 2002

(30) Foreign Application Priority Data
Jun. 16, 2000 (JP) ........................................ 2000-182349

(51) Int. Cl.⁷ .............................. G05B 5/00; H02H 7/08; H02P 1/04; H02P 3/00; H02P 5/00
(52) U.S. Cl. ..................... 318/471; 318/268; 318/907.5; 318/934
(58) Field of Search ................................ 318/246, 268, 318/277, 445, 449, 452, 456, 461, 465, 471, 484, 458; 388/825, 830, 833, 907.2, 907.5, 910, 921, 934

(56) References Cited

U.S. PATENT DOCUMENTS

| 4,085,594 | A | * | 4/1978 | Mayer ........................... 62/171 |
| 5,484,012 | A | | 1/1996 | Hiratsuka ...................... 165/40 |
| 5,525,878 | A | * | 6/1996 | Buchanan et al. ........... 318/443 |
| 5,529,112 | A | * | 6/1996 | King et al. ................... 318/626 |
| RE35,716 | E | * | 1/1998 | Stapleton et al. ............... 435/3 |
| 5,731,674 | A | * | 3/1998 | Jeske ........................... 318/439 |
| 6,029,119 | A | | 2/2000 | Atkinson ...................... 702/132 |
| 6,111,379 | A | * | 8/2000 | Feldtkeller ................... 318/471 |
| 6,134,667 | A | | 10/2000 | Suzuki et al. ................ 713/300 |
| 6,297,607 | B1 | * | 10/2001 | Becker ........................ 318/471 |

FOREIGN PATENT DOCUMENTS

| JP | 7248852 | 9/1995 |
| JP | 7-253485 | 10/1995 |
| JP | 9-250489 | 9/1997 |
| JP | 10307648 | 11/1998 |
| JP | 424174 | 3/2001 |

OTHER PUBLICATIONS

Office Action dated Mar. 9, 2004, issued by the Japanese Patent Office with English language translation.

* cited by examiner

Primary Examiner—Marlon Fletcher
(74) Attorney, Agent, or Firm—Finnegan, Henderson, Farabow, Garrett & Dunner, L.L.P.

(57) ABSTRACT

A computer system includes a first heat generating element in which a heat generation amount is changed, a second heat generating element, a fan configured to cool the first and second heat generating elements, a first temperature sensor configured to detect a temperature of the first heat generating element, a second temperature sensor configured to detect a temperature of the second heat generating element, and a controller configured to control a rotation speed of the cooling fan, based on the temperatures detected by the first and second temperature sensors.

10 Claims, 4 Drawing Sheets

| VALUE OF SENSOR $S_A$ > $A_1$ | CONTROL FLAG $F_A$ - ON |
|---|---|
| VALUE OF SENSOR $S_A$ < $A_2$ | CONTROL FLAG $F_A$ - OFF |
| VALUE OF SENSOR $S_B$ > $B_1$ | CONTROL FLAG $F_B$ - ON |
| VALUE OF SENSOR $S_B$ < $B_2$ | CONTROL FLAG $F_B$ - OFF |

|  | CONTROL FLAG $F_B$ - ON | CONTROL FLAG $F_B$ - OFF |
|---|---|---|
| CONTROL FLAG $F_A$ - ON | $R_4$ | $R_2$ |
| CONTROL FLAG $F_A$ - OFF | $R_3$ | $R_1$ |

COMPUTER SYSTEM AND METHOD OF CONTROLLING ROTATION SPEED OF COOLING FAN

CROSS-REFERENCE TO RELATED APPLICATIONS

This application is based upon and claims the benefit of priority from the prior Japanese Patent Application No. 2000-182349, filed Jun. 16, 2000, the entire contents of which are incorporated herein by reference.

BACKGROUND OF THE INVENTION

The present invention relates to a computer system and a method of controlling the rotation speed of a cooling fan, and particularly, to a method for controlling a cooling fan applied to a computer system including a CPU having a power save mode.

In recent personal computer systems of a laptop or notebook type, it is necessary to reduce not only the temperature of the CPU but also the surface temperature of the casing. In particular, it is necessary to reduce an increase of the surface temperature of the casing due to heat generation from the power source circuit. Also, rotation of a cooling fan results in a shorter battery life and unwanted noise. Therefore, it is required to put the fan not rotated as much as possible and to lower the rotation speed of the fan as much as possible (per unit time). Therefore, it is desirable to efficiently cool the CPU and power source circuit using a cooling fan.

Meanwhile, the element in a computer system, which generates most heat, is the CPU. Therefore, a cooling module which integrates a heat sink and a fan together is installed on the CPU, and ON/OFF control or rotation speed control of the fan is carried out in accordance with the detection value (temperature) of a temperature sensor included in the CPU. In this case, ventilation of the power source circuit is carried out at the same time the fan is rotated. Thus, the module also serves to cool the power source circuit. Control is performed only on the basis of the temperature of the CPU because it is supported that "the temperature of the power source circuit is high when the temperature of the CPU is high, and the temperature of the power source circuit is low when the temperature of the CPU is low".

In recent years, INTEL's SpeedStep™ power-saving technology has adopted in CPUs. This CPU automatically switches to a power save mode using a low voltage and a low CPU clock frequency from a normal mode using a high voltage and a high CPU clock frequency during operation. In the power save mode, the power consumption of the CPU is reduced so that the heat generation of the CPU can be restricted. However, in view of the entire power source circuit, heat generation of the power source circuit is left substantially unchanged because power consumption of the other units does not change. Hence, the conventional supposition that "the temperature of the power source circuit is low when the temperature of the CPU is low" is not satisfied. There appears a situation in which "the temperature of the power source circuit is high even when the temperature of the CPU is low". Therefore, there may be a case where the power source circuit has an unexpectedly high temperature with control based only on the temperature of the CPU. Peripheral circuits hence may be damaged.

BRIEF SUMMARY OF THE INVENTION

Accordingly, it is an object of the present invention to provide a computer system and a method of controlling a cooling fan, which is capable of reducing the generation of noise and achieving efficient and safe cooling in a computer system including a heat generating element in which a heat generation amount is changed, and another heat generating element.

According to one aspect of the present invention, there is provided a computer system comprising: a first heat generating element in which a heat generation amount is changed; a second heat generating element; a fan configured to cool the first and second heat generating elements; a first temperature sensor configured to detect a temperature of the first heat generating element; a second temperature sensor configured to detect a temperature of the second heat generating element; and a controller configured to control a rotation speed of the cooling fan, based on the temperatures detected by the first and second temperature sensors.

According to another aspect of the present invention, there is provided a method of controlling a rotation speed of a cooling fan in a computer system including a first heat generating element in which a heat generation amount is changed and a second heat generating element, the method comprising: cooling the first and second heat generating elements by a fan; detecting a temperature of the first heat generating element by a first temperature sensor; detecting a temperature of the second heat generating element by a second temperature sensor; and controlling the rotation speed of the cooling fan, based on the temperatures respectively detected by the first and second temperature sensors.

According to still another aspect of the present invention, there is provided a computer system comprising: a CPU capable of operating at a first frequency and a second frequency higher than the first frequency and brought into different heat generation states, respectively, in correspondence with the frequencies; a heat generating element different from the CPU; a fan configured to cool the CPU and the heat generating element; a first temperature sensor configured to detect a temperature at which the CPU should be cooled; a second temperature sensor configured to detect a temperature at which the heat generating element should be cooled; and a controller configured to control the fan to cool the heat generating element, if the second temperature sensor detects the temperature at which the heat generating element should be cooled, in a state where the CPU operates at the first frequency and the first temperature sensor does not detect the temperature at which the CPU should be cooled.

According to still another aspect of the present invention, there is provided a computer system comprising: a CPU capable of operating at a first frequency and a second frequency higher than the first frequency; a heat generating element different from the CPU; a fan configured to cool the CPU and the heat generating element; a temperature sensor configured to detect a temperature at which the heat generating element should be cooled; and a controller configured to control the fan to cool the CPU and the heat generating element, if the temperature sensor detects the temperature at which the heat generating element should be cooled, while the CPU operates at the first frequency.

According to still another aspect of the present invention, there is provided a computer system comprising: a first heat generating element; a second heat generating element; a fan configured to cool the first and second heat generating elements, by introducing cooling gas to the first heat generating element and further introducing the cooling gas to the second heat generating element through the first heat generating element; and a controller configured to control the fan to rotate at a higher speed in a case of cooling the second heat generating element than in a case of cooling the first heat generating element.

According to still another aspect of the present invention, there is provided a computer system comprising: a CPU capable of operating in at least two kinds of states having respectively different heat generation levels; a heat generating element different from the CPU; a fan configured to cool the CPU and the heat generating element, by introducing cooling gas to the CPU and further introducing the cooling gas to the heat generating element through the CPU; a first temperature sensor configured to detect a temperature of the CPU; a second temperature sensor configured to detect a temperature of the heat generating element; and a controller configured to control the fan to rotate at a first rotation speed if the first temperature sensor detects a temperature at which the CPU should be cooled and if the second temperature sensor does not detect a temperature at which the heat generating element should be cooled, control the fan to rotate at a second rotation speed higher than the first rotation speed if the first temperature sensor does not detect the temperature at which the CPU should be cooled and if the second temperature sensor detects the temperature at which the heat generating element should be cooled, and control the fan to rotate at a third rotation speed higher than the second rotation speed if the first temperature sensor detects the temperature at which the CPU should be cooled and if the second temperature sensor detects the temperature at which the heat generating element should be cooled.

According to still another aspect of the present invention, there is provided a method of controlling a rotation speed of a cooling fan in a computer system including a CPU capable of operating at a first frequency and a second frequency higher than the first frequency and brought into different heat generation states in correspondence with the frequencies, respectively, and a heat generating element different from the CPU, the method comprising; cooling the CPU and the heat generating element by a fan; detecting a temperature at which the CPU should be cooled, by a first temperature sensor; detecting a temperature at which the heat generating element should be cooled, by a second temperature sensor; and controlling the fan to cool the heat generating element, if the second temperature sensor detects the temperature at which the heat generating element should be cooled, in a state where the CPU operates at the first frequency and the first temperature sensor does not detect the temperature at which the CPU should be cooled.

According to still another aspect of the present invention, there is provided a method of controlling a rotation speed of a cooling fun in a computer system including a CPU capable of operating at a first frequency and a second frequency higher than the first frequency, and a heat generating element different from the CPU, the method comprising: cooling the CPU and the heat generating element by a fan; detecting a temperature at which the heat generating element should be cooled, by a temperature sensor; and controlling the fan to cool the CPU and the heat generating element, if the temperature sensor detects the temperature at which the heat generating element should be cooled, while the CPU operates at the first frequency.

According to still another aspect of the present invention, there is provided a method of controlling a rotation speed of a cooling fan in a computer system including a first heat generating element and a second heat generating element, the method comprising: cooling the first and second heat generating elements by the fan, by introducing cooling gas to the first heat generating element and further introducing the cooling gas to the second heat generating element through the first heat generating element; and controlling the fan to rotate at a higher speed in case of cooling the second heat generating element than in case of cooling the first heat generating element.

According to still another aspect of the present invention, there is provided a method of controlling a rotation speed of a cooling fan in a computer system including a CPU capable of operating in at least two kinds of states having respectively different heat generation levels, and a heat generating element different from the CPU, the method comprising: cooling the CPU and the heat generating element by a fan, by introducing cooling gas to the CPU and further introducing the cooling gas to the heat generating element through the CPU; detecting a temperature of the CPU by a first temperature sensor; detecting a temperature of the heat generating element by a second temperature sensor; and controlling the fan to rotate at a first rotation speed if the first temperature sensor detects a temperature at which the CPU should be cooled and if the second temperature sensor does not detect a temperature at which the heat generating element should be cooled, controlling the fan to rotate at a second rotation speed higher than the first rotation speed if the first temperature sensor does not detect the temperature at which the CPU should be cooled and if the second temperature sensor detects the temperature at which the heat generating element should be cooled, and controlling the fan to rotate at a third rotation speed higher than the second rotation speed if the first temperature sensor detects the temperature at which the CPU should be cooled and if the second temperature sensor detects the temperature at which the heat generating element should be cooled.

According to still another aspect of the present invention, there is provided a computer system comprising: a CPU; a power source circuit; a first temperature sensor configured to detect a temperature of the CPU; a second temperature sensor configured to detect a temperature of the power source circuit; and a drive control circuit configured to drive and control a specific element, based on at least one of the temperatures detected by the first and second temperature sensors.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

In the following, an embodiment of the present invention will be explained with reference to the drawings.

Figure 1:
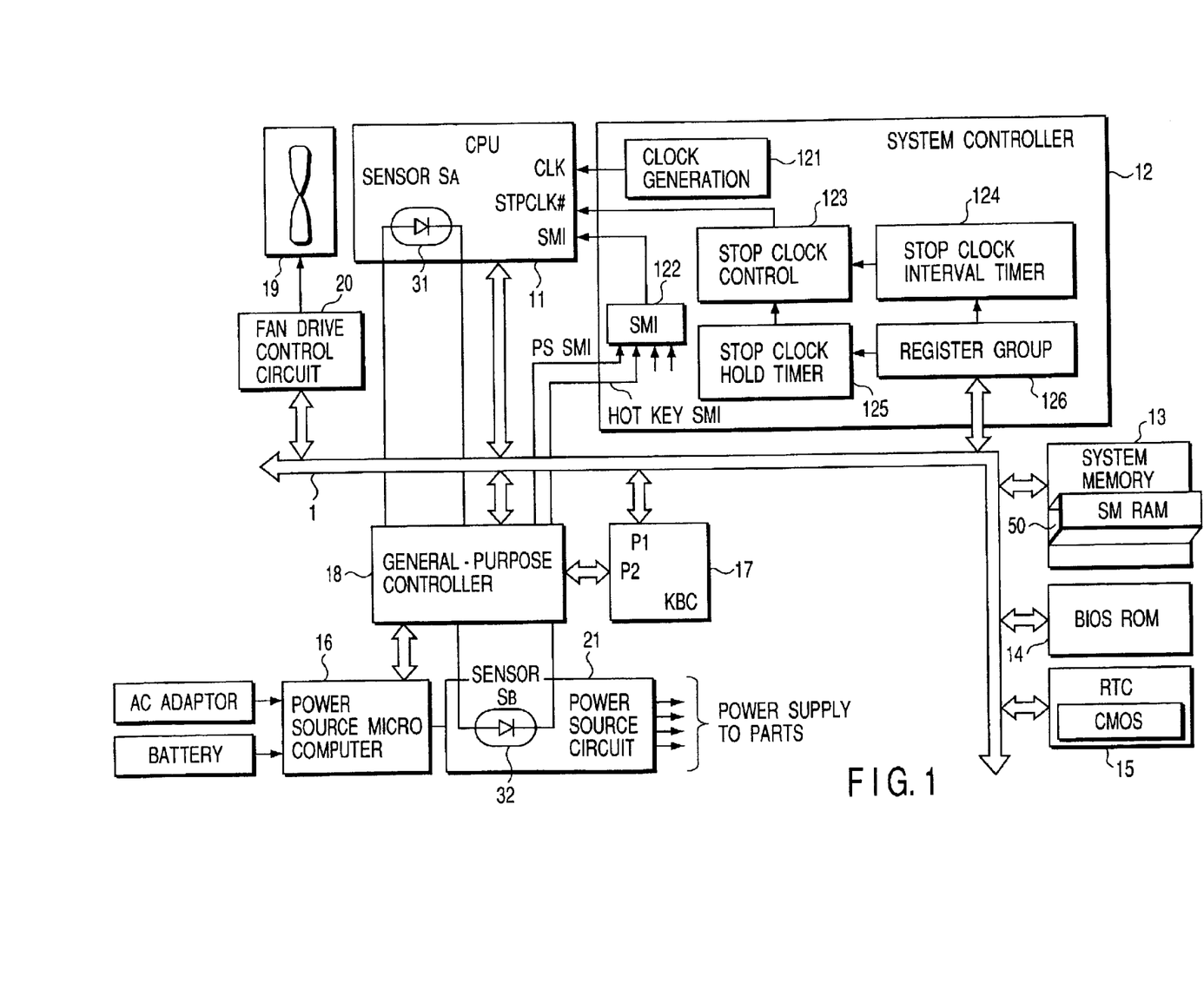
FIG. 1 is a block diagram showing the structure of a computer system according to an embodiment of the present invention.

FIG. 1 is a block diagram showing the structure of a computer system according to the embodiment of the present invention.

This computer system is, for example, a portable personal computer system of a laptop or notebook type. The system includes a CPU 11, a system controller 12, a system memory 13, a BIOS-ROM 14, a real-time clock (RTC) 15, a power source micro-computer 16, a keyboard controller 17, a general-purpose controller 18, a cooling fan 19, a fan drive control circuit 20, a power source circuit 21, a CPU temperature sensor 31 (which may be hereinafter called a sensor $S_A$), and a power-source-circuit temperature sensor 32 (which may be hereinafter called a sensor $S_B$).

For example, a microprocessor manufactured by INTEL and adopting SpeedStep™ technology as a power save technique is used as the CPU 11. The CPU 11 includes a PLL circuit. Based on an external clock CLK, the PLL circuit generates an internal clock CLK 2 of a higher speed than the external clock CLK. Three operation modes which respectively cause different power consumptions (or which respectively result in three different heat generation amounts) are prepared for the CPU 11, e.g., there are a normal state, a stop-grant state, and a stop-clock state.

The normal state corresponds to a normal operation mode of the CPU 11. This normal state causes the greatest power consumption (or the most heat generation). Ordinary commands are executed in this normal state.

This normal state further includes two operation modes. One is a "Maximum Performance Mode" in which the heat generation amount is largest and the CPU operates at a high speed and a high voltage. The other is a "Battery Optimized Mode" in which the operation clock and the operation voltage are lower than those of the "Maximum Performance Mode". By lowering the operation clock and the operation voltage, the power consumption of the CPU 11 is reduced and the heat generation amount is set to be lower than that of the "Maximum Performance Mode".

The stop clock state corresponds to a power save mode. This stop clock state results in the least power consumption (or the smallest heat generation amount). In the stop clock state, not only execution of commands is stopped but also the external clock CLK and the internal clock CLK 2 are stopped.

The stop grant state is an intermediate state between the normal state and the stop clock state and corresponds to a power save mode. The consumption current in this stop grant state is as small as about 20 to 55 mA. In the stop grant state, commands are not executed. Although the external clock CLK and the internal clock CLK 2 are both running, supply of the internal clock CLK 2 for the internal logic of the CPU (CPU core) is inhibited. In the stop grant state, the external clock CLK can be stopped. If the external clock CLK is stopped in this stop grant state, the CPU 11 shifts to the stop clock state from the stop grant state.

Transition between the normal state and the stop grant state can be achieved by a stop clock (STPCLK#) signal at a high speed.

That is, when the STPCLK# signal supplied to the CPU 11 in the normal state is enabled, i.e., when the signal is set in an active state, the CPU 11 executes no next command after the CPU 11 completes a command which is presently being executed. The CPU 11 instead empties out all the internal pipelines, then executes a stop grant cycle, and transits to the stop grant state from the normal state. Meanwhile, when the STPCLK# signal is disabled in the stop grant state, i.e., when the signal is set in an inactive state, the CPU 11 shifts from the stop grant state to the normal state, and restarts execution of a next command.

The transition from the stop grant state to the stop clock state is carried out in an instant by stopping the external clock CLK. When supply of the external clock CLK is restarted in the stop clock state, the CPU 11 shifts to the stop grant state after 1 ms.

Based on a similar principle, the two power save modes in the normal state can be switched from each other.

Thus, the CPU 11 used in the present embodiment can shift between a plurality of operation modes which respectively achieve different heat generation amounts.

Also, the CPU 11 has a system management function as follows.

That is, the CPU 11 has an operation mode for executing a system management program dedicated for power management, which is called a system management mode (SMM), in addition to a real mode, a protect mode, and a virtual 86 mode, which are used for executing application programs and programs such as the OS and the like.

The real mode enables access with a memory space of 1 M bytes at most, and determines a physical address by an offset value from a base address expressed by a segment register. The protect mode enables access with a memory space of 4 G bytes per task at most, and uses an address mapping table called a descriptor to determine a linear address. This linear address is finally converted into a physical address by paging. The virtual 86 mode is designed to operate a program, which is constructed so as to operate in the real mode, in a protect mode, and treats a program for the real mode as a task in the protect mode.

The system management mode (SMM) is a pseudo real mode in which no descriptor table is referred to nor paging executed. When a system management interrupt (SMI) is issued to the CPU 11, the operation mode of the CPU 11 is switched to the SMM from the real mode, protect mode, or virtual 86 mode. In the SMM, a system management program dedicated for system management or power save control is executed.

The SMI is a kind of mask-disable interrupt NMI, which has higher priority than a normal NMI or a mask-enable interrupt INTR. By issuing this SMI, various subroutines prepared as system management programs can be started without depending on application programs being executed or the OS environment. In this computer system, the CPU 11 is cooled independently from the OS environment, so that the CPU operation speed and the rotation of the cooling fan 19 are controlled with use of the SMI.

The system controller 12 is a gate array for controlling the memory or I/O in the system, and incorporates hardware for controlling generation of the SMI signals to the CPU 11 and the STPCLK# signals.

The system memory 13 stores an operation system, application programs as processing targets, user data created by the application programs, and the like. The SMRAM (System Management RAM) 50 is an overlay to be mapped over the address space of the addresses 30000H to 3FFFFH of the memory 13. The SMRAM 50 is rendered accessible only when an SMI signal is inputted to the CPU 11.

When the CPU 11 shifts to the SMM, a register or the like of the CPU 11 when CPU status which is an SMI is issued is saved in a stacked form into the SMRAM 50. The SMRAM 50 stores a command for calling a system management program of the BIOS-ROM 14. This command is executed at first when the CPU 11 enters into the SMM, and control transits to the system management program by execution of the command.

The BIOS-ROM 14 serves to store BIOS (Basic I/O System) and is constructed by a flash memory so that the program can be rewritten. The BIOS is constructed so as to operate in the real mode. This BIOS contains an IRT routine which is executed when booting the system, device drivers for controlling various I/O devices, and a system management program. The system management program is executed in the SMM, and contains an SMI program including an SMI processing routine for controlling the CPU operation speed and the rotation of the cooling fan 19, an SMI handler for determining an SMI routine to be executed, and the like.

The SMI handler is a program in the BIOS, which is called firstly when an SMI occurs. By this program, the factor which causes the SMI and an SMI routine corresponding to the factor are executed.

A RTC 15 is a clock module having its own operation battery and includes a CMOS memory constantly supplied by a power source from the battery. This CMOS memory is utilized when storing setup information indicating the system operation environment and the like.

The power source microcomputer 16 is a controller having a timer function to supply a power source for each unit in the system, and is constructed by a one-chip microcomputer. This power source micro-computer 16 manages the status concerning ON/OFF of a reset switch, ON/OFF of a main power source switch, remaining capacity of the battery, connection/disconnection of an AC adaptor, ON/OFF of a display panel open/close detection switch, and the like.

The keyboard controller 17 serves to control an internal keyboard as a standard equipment incorporated in the computer body. The keyboard controller 17 scans a key matrix of the internal keyboard to receive a signal corresponding to a press-down key, and converts the signal into a predetermined key code (scan code). The keyboard controller 17 has two communication ports P1 and P2, and the communication port P1 is connected to a system bus 1 while the communication port P2 is connected to a general-purpose controller 18.

The key code is outputted from the communication port P1 to the system bus 1, as in conventional cases.

The general-purpose controller 18 makes communication among the power source microcomputer 16, keyboard controller 17, and bus 1, and has various controlling functions. Particularly, in the present embodiment, the general-purpose controller 18 has a function of controlling the speed of rotation of the cooling fan 19, based on the temperatures detected by the temperature sensors 31 and 32 (the details of the function will be explained later).

When the general-purpose controller 18 detects that a temperature detected by the temperature sensors 31 and 32 has reached a value of a level which cannot be lowered by the cooling fan, the general-purpose controller 18 generates a PS-SMI to notify the CPU 11 that forced power cutoff should be executed.

The cooling fan 19 serves to cool the CPU 11 and the power source circuit 21. The rotation speed of the cooling fan 19 is controlled variably by the drive control circuit 20. Note that the cooling fan 19, the CPU 11, and the heat sink may be integrated together to construct one cooling module.

The drive control circuit 20 drives and controls the cooling fan 19 in accordance with instructions from the general-purpose controller 18.

The power source circuit 21 is controlled by the power source microcomputer 16 and serves to supply units in the system with predetermined powers, respectively, based on the power from the AC adaptor or the battery.

The temperature sensor 31 (i.e., the sensor $S_A$) serves to detect the temperature of the CPU 11 and is constructed by a thermistor and the like. The temperature sensor 31 is provided in contact with or near the CPU 11, for example, on the package of the LSI of the CPU 11.

The temperature sensor 32 (i.e., the sensor $S_B$) serves to detect the temperature of the power source circuit 21 and is constructed by a thermistor and the like. This temperature sensor 32 is provided in contact with or near the power source circuit 21.

Next, an explanation will be made of a hardware structure for controlling the generation of SMI and STPCLK#, which is provided in the system controller 12.

In the system controller 12, there are provided a clock generation circuit 121, an SMI generation circuit 122 for supplying the CPU 11 with an SMI, a stop clock control circuit 123 for controlling the generation of the STPCLK#, a stop clock interval timer 124 for controlling the generation interval of the STPCLK#, a stop clock hold timer 125 for controlling the period for which the CPU 11 is held in the stop grant state, and a register group 126 for rendering the time-out count values of the timers 124 and 125 programmable.

Figure 2:
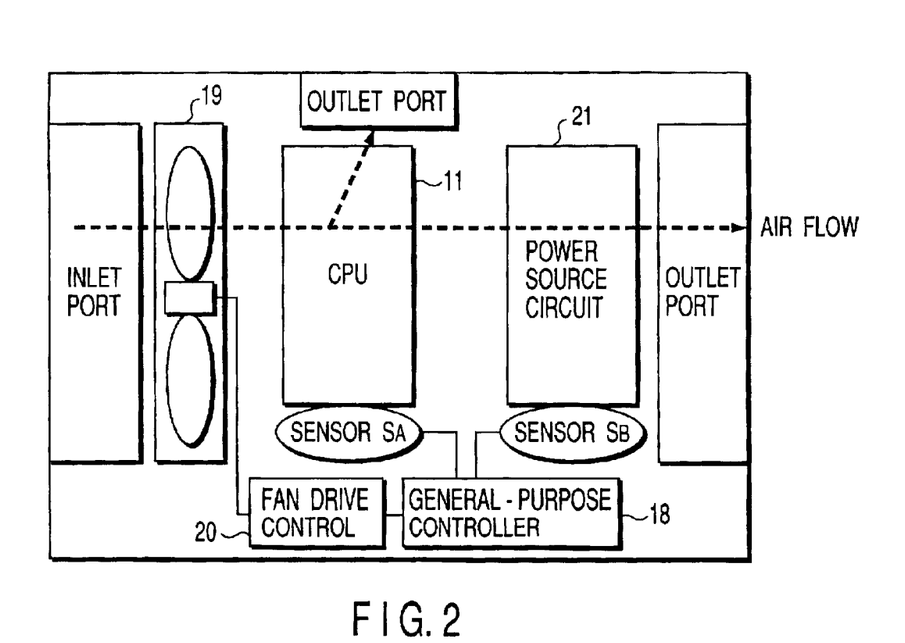
FIG. 2 is a view showing a layout relationship between a cooling fan, a CPU, and a power source circuit.

FIG. 2 is a view showing a layout relationship between the cooling fan 19, the CPU 11, and the power source circuit 21.

As can be seen from this figure, air is taken in through an inlet port as the cooling fan 19 rotates. The air thus taken in reaches firstly the CPU 11, and part of the air is exhausted from the outlet port which is closest to the CPU. The remaining part of the air which has passed over the CPU 11 then reaches and cools the power source circuit 21, and is thereafter discharged from an outlet port in the right-hand side of the figure. In this manner, the cooling fan 19 is arranged such that it sends air simultaneously to both the CPU 11 and the power source circuit 21 and cools them.

Figure 3:
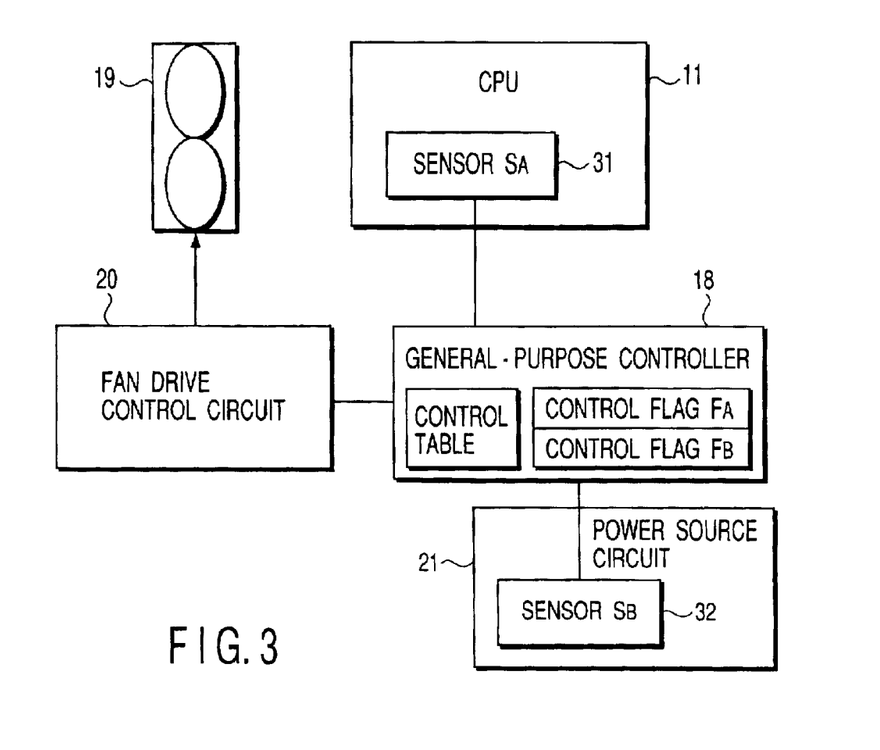
FIG. 3 is a functional block diagram showing simply a relationship between components significantly related to the invention in the structure shown in FIG. 1.

FIG. 3 is a functional block diagram simply showing the relationship between elements which are particularly related to the present invention, in the structure shown in FIG. 1.

That is, the general-purpose controller 18 is electrically connected with the temperature sensor 31 (i.e., sensor $S_A$) for detecting the temperature of the CPU 11, the temperature sensor 32 (i.e., sensor $S_B$) for detecting the temperature of the power source circuit 21, and the fan drive control circuit 20. The fan drive control circuit 20 is also connected to the cooling fan 19. The general-purpose controller 18 has control flags $F_A$, $F_B$, and a control table (described later) used for determining the rotation speed of the cooling fan 19.

In this connection relationship, the general-purpose controller 18 uses the control flags $F_A$, $F_B$, and control table, to determine the rotation speed of the cooling fan 19, based on the detection values of the two sensors 31 and 32. The general-purpose controller 18 instructs the fan drive control circuit 20 so as to drive and control the cooling fan 19 at a determined rotation speed. In this manner, the cooling fan 19 is rotated at a rotation speed determined by the general-purpose controller 18, under drive control by the fan drive control circuit 20.

Figure 4:
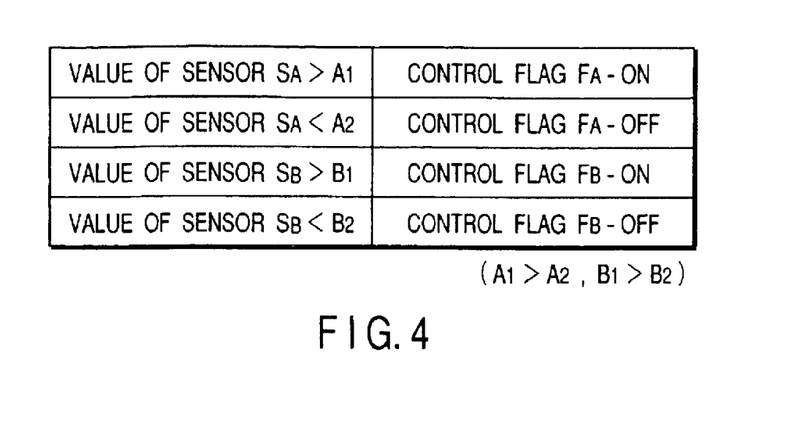
FIG. 4 is a table showing a relationship between values of temperature sensors and control flags.

FIG. 4 shows a relationship between the values of the sensors $S_A$ and $S_B$ and the values of the control flags $F_A$ and $F_B$.

That is, the general-purpose controller 18 sets the control flag $F_A$ in an ON-state (expressed as $F_A$-ON) when the detection value of the sensor $S_A$ exceeds a predetermined value (threshold value) A1. On the other hand, the controller 18 sets the control flag $F_A$ in an OFF-state (expressed as $F_A$-OFF) when the detection value of the sensor $S_A$ comes to be lower than a predetermined value A2. Similarly, the general-purpose controller 18 sets the control flag $F_B$ in an ON-state (expressed as $F_B$-ON) when the detection value of the sensor $S_B$ exceeds a predetermined value (threshold value) B1. On the other hand, the controller 18 sets the control flag $F_B$ in an OFF-state (expressed as $F_B$-OFF) when the detection value of the sensor $S_B$ comes to be lower than a predetermined value B2.

In this case, the relationship between the predetermined values should preferably be A1>A2 and B1>B2. Numerical values thereof will be, for example, A1=65° C., A2=50° C., B1=60° C., and B2=55° C. These predetermined values are stored in an internal memory or the like included in the general-purpose controller 18.

Figure 5:
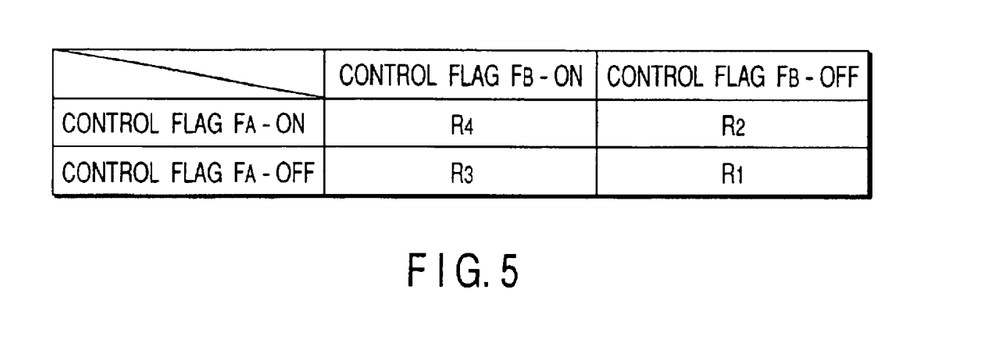
FIG. 5 is a table showing contents of a control table used by a general-purpose controller.

Next, the control table will be explained with reference to FIG. 5.

The control table is used by the general-purpose controller 18 to determine the rotation speed of the cooling fan 19. This control table defines the value to which the rotation speed of the cooling should be set in correspondence with the states of the control flags $F_A$ and $F_B$.

In the present embodiment, the rotation speed of the cooling fan 19 is set to any of next four values (rotation speed=R1, R2, R3, or R4 where R1<R2<R3<R4 is given).

(1) Rotation Speed R1 (=0)

When both of the control flags $F_A$ and $F_B$ are in OFF states, the cooling fan 19 is not rotated.

(2) Rotation Speed R2

When the control flag $F_A$ is in an ON state and the control flag $F_B$ is in an OFF state, the temperature of the CPU 11 exceeds a predetermined value so that the CPU 11 needs to be cooled. The CPU 11 is provided at a position relatively close to the cooling fan 19, so that it can be sufficiently cooled at a low rotation speed. The cooling fan 19 is hence rotated at a low speed.

(3) Rotation Speed R3

When the control flag $F_A$ is in an OFF-state and the control flag $F_B$ is in an ON-state, the temperature of the power circuit 21 exceeds a predetermined value, so that the power source circuit 21 needs to be cooled. In this case, the power source circuit 21 is arranged at a position relatively far from the cooling fan 19, and air from the cooling fan 19 is once heated by the CPU 11 and then fed to the power source circuit 21. Therefore, the cooling fan 19 is rotated at a middle speed, i.e., at the rotation speed R3 higher than the rotation speed R2. In this manner, there is no possibility that the temperature of the power source circuit 21 may increase to be higher than expected when the CPU 11 is in a power-save mode.

(4) High Speed Rotation of Fan

When the control flag $F_A$ is in an ON-state and the control flag $F_B$ is in an ON-state, the temperatures of the CPU 11 and the power circuit 21 both exceed predetermined values. Therefore, both the CPU 11 and the power source circuit 21 need to be cooled. In this case, the cooling fan 19 is rotated at a rotation speed R4 which is higher than the rotation speed R3.

Figure 6:
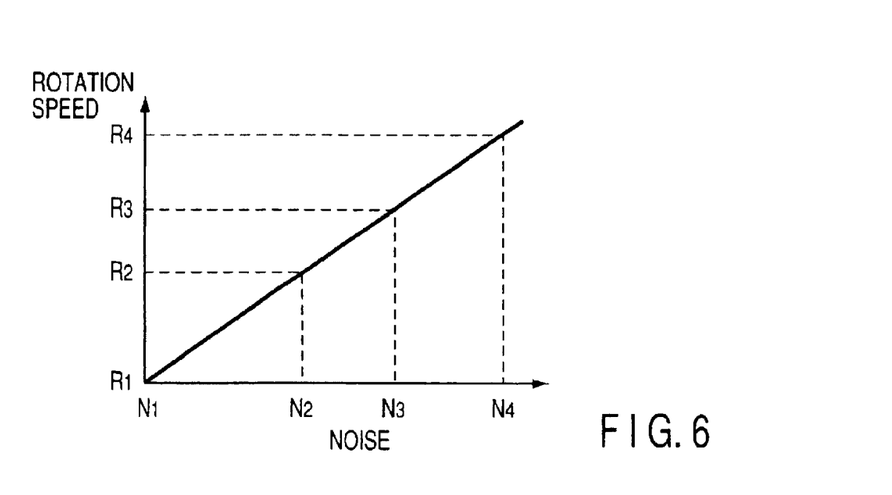
FIG. 6 is a graph showing a relationship between the rotation speed of the cooling fan and noise.

FIG. 6 shows a relationship between the rotation speed and noise.

As can be seen from the figure, noise increases in the order of N1, N2, N3, and N4 as the rotation speed of the cooling fan 19 increases in the order of R1, R2, R3, and R4. In the present embodiment, the rotation speed of the cooling fan 19 is appropriately determined such that the air capacity necessary for cooling is fed from the cooling fan 19 in accordance with the temperature changes of the CPU 11 and the power source circuit 21. Therefore, efficient cooling can be achieved while reducing noise as much as possible.

Figure 7:
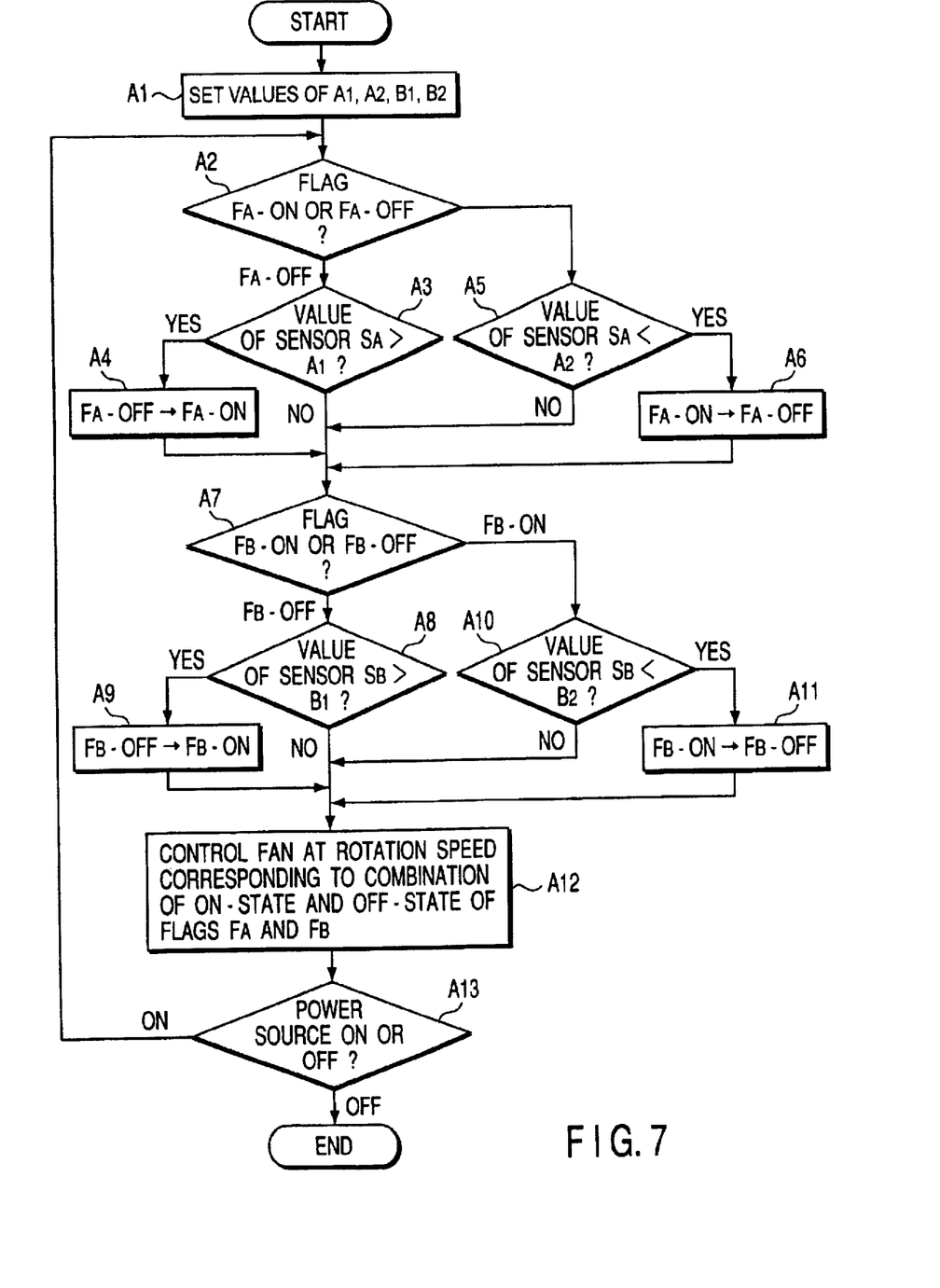
FIG. 7 is a flowchart showing the operation of the embodiment.

Next, operation of the present embodiment will be explained with reference to the flowchart shown in FIG. 7.

At first, two predetermined values A1 and A2 are prepared for the sensor $S_A$ corresponding to the CPU 11, as well as two predetermined values B1 and B2 for the sensor $S_B$ corresponding to the power source circuit 21. These values are stored into an internal memory or the like of the general-purpose controller 18 (step A1).

If the detection value of the sensor $S_A$ exceeds the predetermined value A1 when the flag $F_A$ corresponding to the CPU 11 is in an OFF state during operation of the computer system (YES in steps A2 and A3), the general-purpose controller 18 changes the status of the flag $F_A$ from OFF to ON (step A4). If the detection value of the sensor $S_A$ does not exceed the predetermined value A1, the status of the flag $F_A$ is not changed.

Alternatively, if the detection value of the sensor $S_A$ goes under the predetermined value A2 when the flag $F_A$ is in an ON state (YES in steps A2 and A5), the general-purpose controller 18 changes the status of the flag $F_A$ from ON to OFF (step A6). If the detection value of the sensor $S_A$ does not go under the predetermined value A2, the status of the flag $F_A$ is not changed.

Also, if the detection value of the sensor $S_B$ exceeds the predetermined value B1 when the flag $F_B$ corresponding to the power source circuit 21 is in an OFF state (YES in steps A7 and A8), the general-purpose controller 18 changes the status of the flag $F_B$ from OFF to ON (step A9). If the detection value of the sensor $S_B$ does not exceed the predetermined value B1, the status of the flag $F_B$ is not changed.

Alternatively, if the detection value of the sensor $S_B$ goes under the predetermined value B2 when the flag $F_B$ is in an ON state (YES in steps A7 and A10), the general-purpose controller 18 changes the status of the flag $F_B$ from ON to OFF (step A11). If the detection value of the sensor $S_B$ does not go under the predetermined value B2, the status of the flag $F_B$ is not changed.

Next, the general-purpose controller 18 determines a rotation speed corresponding to the states of the flags $F_A$ and $F_B$, by referring to the control table. The controller 18 instructs the fan drive control circuit 20 so as to drive and control the cooling fan 19 at the determined rotation speed (step A12). In this manner, the cooling fan 19 rotates at a rotation speed which is determined by the general-purpose controller 18 under drive control from the fan drive control circuit 20.

Next, the general-purpose controller 18 determines whether the power source should be kept on or be turned off (step A13). If the power source should be kept off, the controller 18 returns to the step A2 and continues processing. Otherwise, if the power source should be turned off, the controller 18 executes processing for turning off the power source. For example, if it is detected that a temperature detected by the temperature sensors 31 and 32 has reached a value of a level which cannot be lowered any more by the cooling fan 19, the general-purpose controller 18 issues a PS-SMI and notifies the CPU 11 that the power source should be forcedly turned off. In this manner, the CPU 11 executes processing such as data withdrawal or the like, and thereafter, the power source microcomputer 16 executes power shut-off.

Thus, the rotation speed of the cooling fan 19 is appropriately determined such that the cooling fan 19 feeds air necessary for cooling, in correspondence with the states of the temperature sensors respectively provided for the CPU 11 and the power source circuit 21, in the embodiment described above. It is therefore possible to perform efficient cooling while reducing noise as much as possible. Also, in the embodiment described above, the temperature of the power source circuit 21 is controlled not to be higher than expected when the CPU is in a power-save mode. Therefore, peripheral circuits are not damaged.

Note that the present invention is not limited to the above embodiment but can be variously modified and practiced within the scope of the invention. For example, the predetermined values for the temperature sensors have been explained as being fixed in the above embodiment. However, these values may be dynamically changed in accordance with the detection values of the temperature sensors or detection values of other temperature sensors. In this case, the predetermined values may be dynamically changed in accordance with detection values of a plurality of temperature sensors.

Further, it is possible to provide a drive control circuit which drives and controls a specific element other than the cooling fan, based on at least one of the temperatures detected by the temperature sensors.

As has been specifically explained above, according to the present invention, cooling can be efficiently and safely carried out while reducing the generation of noise, in a computer system which includes a heat generating element having a plurality of operation modes respectively having different heat generation amounts and other heat generating elements.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A computer system comprising:
  a first heat generating element in which a heat generation amount is changed;
  a second heat generating element;
  a fan configured to cool the first and second heat generating elements;
  a first temperature sensor configured to detect a temperature of the first heat generating element;
  a second temperature sensor configured to detect a temperature of the second heat generating element; and
  a controller configured to control a rotation speed of the cooling fan, based on the temperatures detected by the first and second temperature sensors, the controller being configured to cause a processor to execute processing which includes data withdrawal when the temperature detected by the first temperature sensor exceeds a predetermined value, and to cause a power source to be turned off after the processor executes the processing which includes the data withdrawal.

2. The computer system according to claim 1, wherein the controller includes a first control flag which is switched on/off in accordance with a change of the temperature detected by the first sensor, and a second control flag which is switched on/off in accordance with a change of the temperature detected by the second sensor, and the rotation speed of the cooling fan is determined in correspondence with a combination of states of the first and second control flags.

3. The computer system according to claim 2, wherein the first control flag is switched on when the temperature detected by the first sensor exceeds a first predetermined value, and the first control flag is switched off when the temperature detected by the first sensor goes under a second predetermined value, and
  the second control flag is switched on when the temperature detected by the second sensor exceeds a third predetermined value, and the second control flag is switched off when the temperature detected by the second sensor goes under a fourth predetermined value.

4. The computer system according to claim 1, wherein the first heat generating element comprises a CPU.

5. A method of controlling a rotation speed of a cooling fan in a computer system including a first heat generating element in which a heat generation amount is changed and a second heat generating element, the method comprising:
  cooling the first and second heat generating elements by a fan;
  detecting a temperature of the first heat generating element by a first temperature sensor;
  detecting a temperature of the second heat generating element by a second temperature sensor;
  controlling the rotation speed of the cooling fan, based on the temperatures respectively detected by the first and second temperature sensors;
  causing a processor to execute processing which includes data withdrawal when the temperature detected by the first temperature sensor exceeds a predetermined value; and
  causing a power source to be turned off after the processor executes the processing which includes the data withdrawal.

6. The method according to claim 5, wherein in the controlling the rotation speed of the cooling fan, a first control flag is switched on/off in accordance with a change of the temperature detected by the first sensor, a second control flag is switched on/off in accordance with a change of the temperature detected by the second sensor, and the rotation speed of the cooling fan is determined in correspondence with a combination of states of the first and second control flags.

7. The method according to claim 6, wherein the first control flag is switched on when the temperature detected by the first sensor exceeds a first predetermined value, and the first control flag is switched off when the temperature detected by the first sensor goes under a second predetermined value, and the second control flag is switched on when the temperature detected by the second sensor exceeds a third predetermined value, and the second control flag is switched off when the temperature detected by the second sensor goes under a fourth predetermined value.

8. The method according to claim 5, wherein the first heat generating element comprises a CPU.

9. A method of controlling a rotation speed of a cooling fan in a computer system, the method comprising:

cooling a CPU and a heat generating element by a fan, by introducing cooling gas to the CPU and further introducing the cooling gas to the heat generating element through the CPU, the CPU capable of operating in at least two kinds of states having respectively different heat generation levels, and a heat generating element different from the CPU;

detecting a temperature of the CPU by a first temperature sensor;

detecting a temperature of the heat generating element by a second temperature sensor;

controlling the fan to rotate at a first rotation speed if the first temperature sensor detects a temperature at which the CPU should be cooled and if the second temperature sensor does not detect a temperature at which the heat generating element should be cooled, controlling the fan to rotate at a second rotation speed higher than the first rotation speed if the first temperature sensor does not detect the temperature at which the CPU should be cooled and if the second temperature sensor detects the temperature at which the heat generating element should be cooled, and controlling the fan to rotate at a third rotation speed higher than the second rotation speed if the first temperature sensor detects the temperature at which the CPU should be cooled and if the second temperature sensor detects the temperature at which the heat generating element should be cooled;

causing a processor to execute processing which includes data withdrawal when the temperature detected by the first temperature sensor exceeds a predetermined value which cannot be lowered by the fan; and causing a power source to be turned off after the processor executes the processing which includes the data withdrawal.

10. A computer system comprising:

a first heat generating element comprising a CPU;

a second heat generating element;

a first temperature sensor configured to detect a temperature of the first heat generating element;

a second temperature sensor configured to detect a temperature of the second heat generating element;

a fan configured to cool the first and second heat generating elements; and a controller configured to control the fan to i) rotate at a first rotation speed if the temperature detected by the first temperature exceeds a first value and the temperature detected by the second temperature does not exceed a second value, and ii) rotate at a second rotation speed higher than the first rotation speed if the temperature detected by the first temperature does not exceed the first value and the temperature detected by the second temperature exceeds the second value, the controller being configured to cause the CPU to execute processing which includes data withdrawal when the temperatures detected by the first and second temperature sensors exceed a third value, and to cause a power source to be turned off after the CPU executes the processing which includes the data withdrawal.

* * * * *

UNITED STATES PATENT AND TRADEMARK OFFICE
CERTIFICATE OF CORRECTION

PATENT NO.    : 6,888,332 B2                                          Page 1 of 1
DATED         : May 3, 2005
INVENTOR(S)   : Matsushita It is certified that error appears in the above-identified patent and that said Letters Patent is hereby corrected as shown below:

Title page,
Item [57], ABSTRACT, delete in its entirety and substitute therefor:
-- A method of controlling a rotation speed of a cooling fan in a computer system including a first heat generating element in which a heat generation amount is changed and a second heat generating element, the method includes cooling the first and second heat generating elements by a fan and detecting a temperature of the first heat generating element by a first temperature sensor. Next the method of controlling a rotation speed includies detecting a temperature of the second heat generating element by a second temperature sensor. Finally, the method includes controlling the rotation speed of the cooling fan, based on the temperatures respectively detected by the first and second temperature sensors, and causing a power source to be turned off when at least the temperatures detected by the first temperature sensor exceeds a predetermined value. --

Signed and Sealed this

Twelfth Day of July, 2005

JON W. DUDAS
*Director of the United States Patent and Trademark Office*